United States Patent [19]
Merritt

[11] Patent Number: 5,835,422
[45] Date of Patent: *Nov. 10, 1998

[54] CIRCUIT AND METHOD FOR GENERATING A CONTROL SIGNAL FOR A MEMORY DEVICE

[75] Inventor: Todd A. Merritt, Boise, Id.

[73] Assignee: Micron Technology, Inc., Boise, Id.

[ * ] Notice: The term of this patent shall not extend beyond the expiration date of Pat. No. 5,644,538.

[21] Appl. No.: 832,039

[22] Filed: Apr. 3, 1997

Related U.S. Application Data

[63] Continuation of Ser. No. 609,738, Mar. 1, 1996, Pat. No. 5,644,538.

[51] Int. Cl.$^6$ ....................................................... G11C 7/00
[52] U.S. Cl. ................... 365/194; 365/195; 365/230.08; 365/233
[58] Field of Search ................................. 365/194, 195, 365/230.08, 233, 189.05

[56] References Cited

U.S. PATENT DOCUMENTS

| | | |
|---|---|---|
| 5,315,557 | 5/1994 | Kim et al. ................................. 365/222 |
| 5,325,328 | 6/1994 | Muroya et al. ..................... 365/189.05 |
| 5,438,548 | 8/1995 | Houston ................................... 365/227 |
| 5,544,124 | 8/1996 | Zagar et al. ........................ 365/230.08 |
| 5,548,560 | 8/1996 | Stephens, Jr. et al. ............... 365/233.5 |
| 5,640,364 | 6/1997 | Merritt et al. ......................... 365/233.5 |
| 5,691,943 | 11/1997 | Yun .................................... 365/189.05 |

Primary Examiner—David C. Nelms
Assistant Examiner—Hien Nguyen
Attorney, Agent, or Firm—Schwegman, Lundberg, Woessner & Kluth, P.A.

[57] ABSTRACT

A memory device (10) for use in an electronic system (12). The system (12) includes a processor (16) that produces a plurality of control signals. The memory device (10) includes a memory array (18) coupled to receive control signals from the processor (18). The memory device (10) also includes a pulse generator (22) that receives at least one of the control signals from the processor (16). The pulse generator (22) includes a latch formed from, for example, a cross coupled pair of NAND-gates (32 and 34). A delayed signal from the latch is coupled to control the reset of the latch such that the latch of the pulse generator (22) outputs a modified control signal for the memory device (10) that has a pulse with a width that is at least as long as the delay.

14 Claims, 5 Drawing Sheets

CIRCUIT AND METHOD FOR GENERATING A CONTROL SIGNAL FOR A MEMORY DEVICE

This application is a continuation of U.S. patent application Ser. No. 08/609,738, filed Mar. 1, 1996, now a U.S. Pat. No. 5,644,538.

TECHNICAL FIELD OF THE INVENTION

The present invention relates generally to memory devices and in particular relates to a circuit and method for generating a control signal for a memory device.

BACKGROUND OF THE INVENTION

When a software program runs on a computer, the computer downloads instructions and data from a disk or hard drive and stores some data in a memory device under the direction of a microprocessor. In recent years, many advances in computer technology have increased the speed of both memory devices and microprocessors. Further, the size and complexity of software programs such as word processors, spread sheets and operating systems has increased dramatically. Thus, it is common for a computer user to purchase and install additional memory devices to a computer after a period of time to avoid the expense of buying a new computer. Unfortunately, the expanded memory increases the load on control lines in the computer from the microprocessor to the memory devices and can adversely affect transition times for control signals, thus preventing proper operation of the memory devices.

In dynamic random access memory (DRAM) devices, for example, a control signal is used in receiving the address of a memory cell from the microprocessor of the computer. A DRAM device stores data in memory cells arranged in an array of rows and columns. To read data from or write data to a memory cell, a processor provides the address of the desired memory cell to the DRAM device. The address contains at least two pieces of information: the row and the column of the desired cell. The processor informs the DRAM device when the row address is ready to be used by the DRAM device by bringing a control signal, referred to as Row Address Strobe ("RAS"), to a specified logic level. The processor then uses a second control signal, referred to as Column Address Strobe ("CAS"), to inform the DRAM device when the column address is ready to be used by the DRAM device. To increase the speed of DRAM devices, many DRAM devices successively access cells in the same row using a pulse train for the CAS control signal. DRAM manufacturers specify acceptable pulse widths for CAS control signals used with their memory devices. The CAS control signal provided to a DRAM device may not meet these specifications because the width of the pulse may be too short in either the high or low logic levels due to higher speeds of processors and the load created by expanded memory. Thus, the DRAM device will not function properly.

There is a need in the art for a memory device that operates properly irrespective of the load on the control lines from the microprocessor.

SUMMARY OF THE INVENTION

A circuit and method for generating a control signal for a memory device is described which generates a control signal which meets the specifications for the memory device, irrespective of the load on the control lines from the microprocessor. In one embodiment, the present invention provides a pulse generator that receives an original signal, such as the CAS control signal for a DRAM device. The pulse generator generates a pulse from the original signal with a width that falls within an acceptable range, irrespective of the width of the pulse in the original signal. The pulse generator includes a latch circuit that receives the original signal from an external source. The pulse generator also includes a delay circuit that is coupled between an output of the latch and a reset input of the latch. The delay circuit generates a reset signal for the latch such that the latch outputs a pulse with a width that is at least as long as the delay from the delay circuit. In one embodiment, the delay circuit introduces a delay in the range of 3 to 7 nanoseconds.

An embodiment of the present invention comprises a DRAM device with a pulse generator that creates an internal CAS control signal based on an external CAS signal received from an external source. Advantageously, the internal CAS signal meets the specifications for the DRAM device such that the addressing circuit can identify a desired cell in the memory array even though the external CAS signal did not meet the specifications for pulse width.

In another illustrative embodiment, the latch comprises a pair of NAND-gates in a cross coupled configuration. In this embodiment, when the external signal transitions to a low logic value, the latch is set and its output follows the external signal to a low logic value. The delay circuit delays the reset signal for a period of time such that the output stays at a low logic level for at least as long as the delay. Thus, the delay of the circuit is selected to assure that the circuit produces pulses of acceptable duration even though the external control signal is unacceptable.

In another illustrative embodiment, the delay circuit only delays the reset signal when the output of the latch transitions from a low logic level to a high logic level. This improves performance of the circuit because it allows the latch to respond immediately to a reset signal once the pulse has been extended.

In another illustrative embodiment, the present invention provides a pulse generator that generates a control signal based on a signal from an external source. Typically, the signal from the external source comprises a pulse train that does not meet specified minimum pulse widths in either its high or its low logic level pulses. For purposes of this specification, the term "pulse generator" includes a circuit that produces a pulse in response to an input signal or that modifies a pulse of an input signal with, for example, a lockout circuit when the pulse does not meet the pulse width requirements. In this embodiment, the pulse generator uses two lockout circuits to produce a control signal that meets these specifications. The first lockout circuit extends a low logic pulse of the signal from the external source to produce an acceptable control signal. The second lockout circuit extends a high logic pulse of the signal from the external source to produce an acceptable control signal. A logic gate selectively provides the output of the two lockout circuits as the output of the pulse generator. In one embodiment, the lockout circuits each include a latch with a delay circuit coupled between an output and a reset input. Further, the first latch receives the external control signal and the second latch receives an output from the first latch.

DETAILED DESCRIPTION OF THE INVENTION

In the following detailed description of the illustrative embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
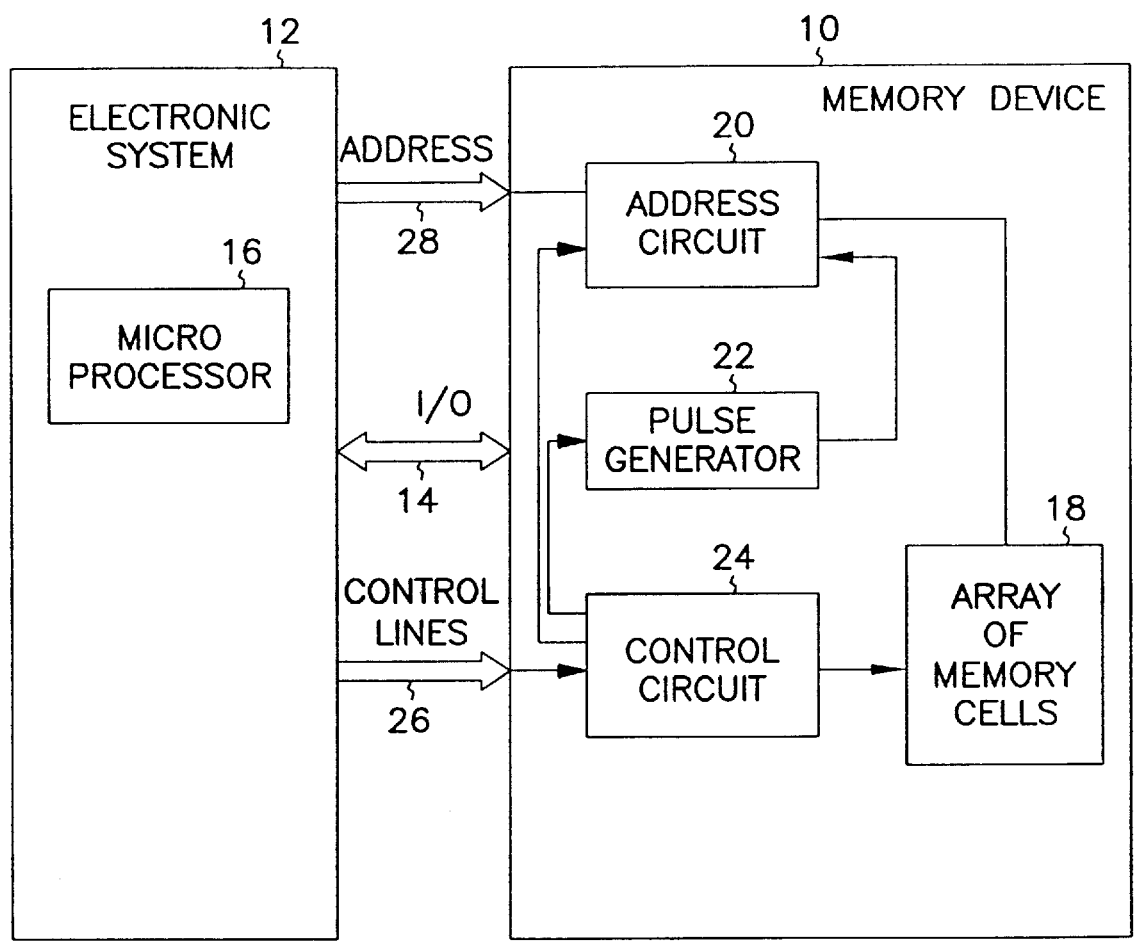
FIG. 1 is a block diagram of an illustrative embodiment of the present invention.

FIG. 1 is a block diagram of a memory device indicated generally at 10. Memory device 10 provides data to and receives data from electronic system 12 over input/output lines 14. Memory device 10 stores the data in an array of memory cells 18. Microprocessor 16 of electronic system 12 produces control and address signals to control the exchange of data between electronic system 12 and memory device 10. In one embodiment, electronic system 12 comprises a microprocessor based computer and memory device 10 comprises a dynamic random access memory (DRAM) memory device. Memory device 10 operates, for example, as an extended data out DRAM, a burst extended data out DRAM or other appropriate memory device.

Memory device 10 comprises address circuit 20, pulse generator 22 and control circuit 24 that combine to locate the proper cell in array 18 for storing or retrieving data. Address circuit 20 is coupled to receive an address from electronic system 12. Further, address circuit 20 provides the address to array 18. Control circuit 24 receives control signals from electronic system 12 over control lines 26. Control circuit 24 is coupled to array 18, pulse generator 22 and address circuit 20.

In operation, pulse generator 22 generates a control signal referred to as column address strobe (CAS) for address circuit 20 that compensates for unacceptable CAS control signals generated by electronic system 12 when the load on control lines 26 reduces the width of pulses in the CAS control signal to below specifications for the memory device.

To access data stored in array 10, microprocessor 16 provides the address of the cell to address circuit 20 in at least two parts: a row address and a column address. Microprocessor 16 indicates that the row address is on address lines 28 by bringing the row address strobe (RAS) signal on one of control lines 26 to a high logic level. Control circuit 24 provides this signal to address circuit 20. Thus, address circuit 20 activates the appropriate row in array 18. To select the cell in the row, microprocessor 16 identifies the column of the selected cell with an address signal on address lines 28. When the address is ready, microprocessor 16 brings the CAS signal on control lines 26 to a low logic level and data is transmitted between electronic system 12 and array 18 over I/O lines 14. To assure that the CAS signal operates properly, pulse generator 22 uses the CAS signal from microprocessor 16 to generate an internal CAS signal that triggers off the falling edge of the external CAS signal. Pulse generator 22 sets the width of the pulses of the CAS signal such that the CAS signal meets the specifications of pulse width for memory device 10. For sake of clarity, the CAS signal from microprocessor 16 is referred to as "XCAS" and the output of pulse generator 22 is referred to as "NEW_CAS" in the description of FIGS. 2 through 5F.

Figure 2:
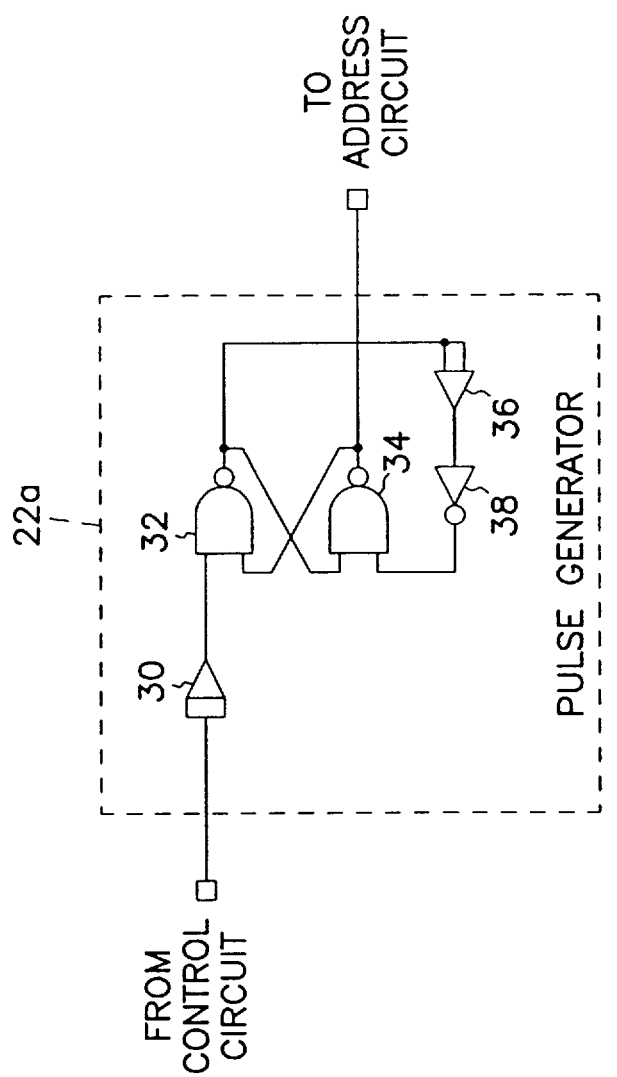
FIG. 2 is a schematic diagram of an illustrative embodiment of a pulse generator for use with the memory device of FIG. 1.

FIG. 2 is an illustrative embodiment of a pulse generator, indicated generally at 22a, for use in memory device 10 of FIG. 1. Advantageously, pulse generator 22a extends a low logic pulse that is too short and also shortens a low logic pulse that is too long so as to provide acceptable low and high pulses based on the XCAS signal. The manner in which pulse generator 22a operates to extend short pulses and shorten long pulses are described in turn below.

Pulse generator 22a comprises an input buffer 30 that is coupled to receive a control signal from control circuit 24. Pulse generator 22a further comprises first and second NAND-gates 32 and 34 that are coupled to form a flip-flop or latch. A first input of NAND-gate 32 is coupled to buffer 30. An output of NAND-gate 34 is coupled to a second input of NAND-gate 32. An output of NAND-gate 32 is coupled to a first input of NAND-gate 34. Finally, the output of NAND-gate 32 is coupled to the input of NAND-gate 34 through delay 36 and inverter 38. The output of NAND-gate 34 is coupled to address circuit 20 of FIG. 1.

In one embodiment, the output of delay 36 is a delayed version of its input when its input transitions from a low logic level to a high logic level. Otherwise, delay 36 passes the output of NAND-gate 32 to the input of NAND-gate 34 within a normal gate delay when its input transitions from a high logic value to a low logic value. This increases the performance of pulse generator 22a because the latch responds without the added delay to a change in the output of NAND-gate 32 after the pulse of the XCAS signal has been extended as described below. Further, delay 36 advantageously comprises a delay of at least 3 nanoseconds so as to produce pulses with an acceptable width.

Figure 3A:
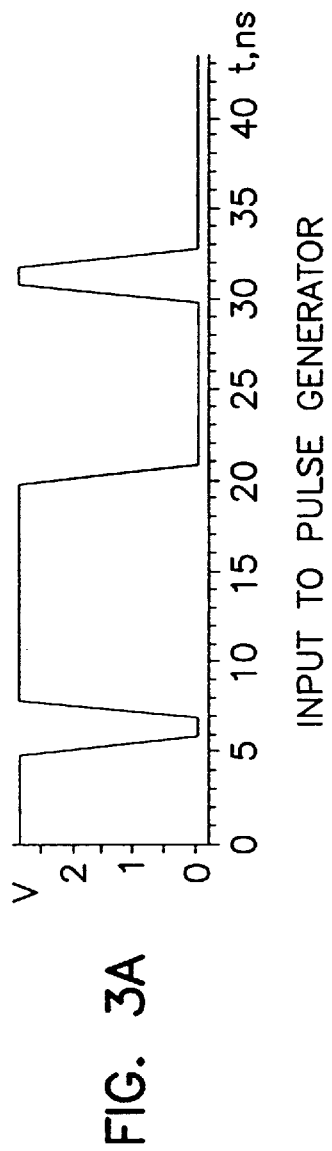
FIGS. 3A and 3B are timing diagrams that illustrate the operation of the pulse generator of FIG. 2.
Figure 3B:
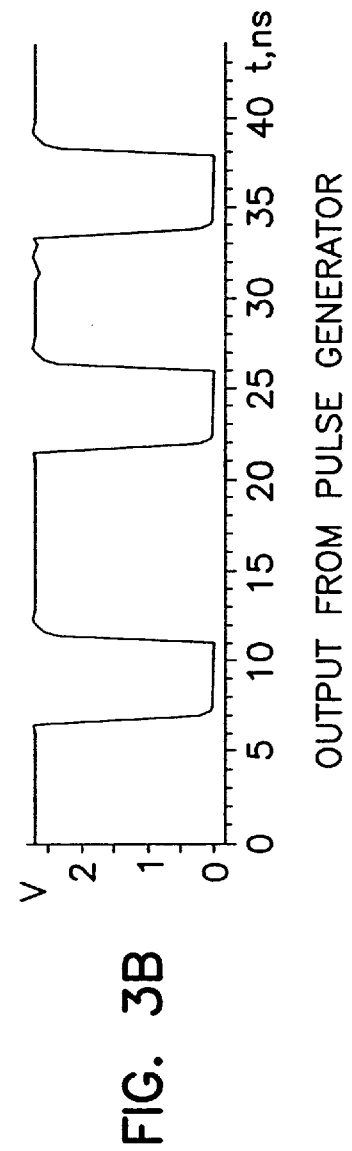

In operation, pulse generator 22a receives the XCAS control signal from control circuit 24 at input buffer 30 and produces an output signal with an acceptable pulse width for address circuit 20. FIG. 3A illustrates a typical XCAS signal and FIG. 3B illustrates the output of pulse generator 22a based on the XCAS signal of FIG. 3A.

In this example, the first low XCAS pulse is too short. Pulse generator 22a extends this pulse. Before 5 ns, the XCAS signal is at a high logic level. In this state, NAND-gate 34 outputs a high logic level to address circuit 20 and NAND-gate 32 outputs a low logic level. Inverter 38 outputs a high logic level. At 5 ns, the XCAS signal goes from a high logic level to a low logic level. NAND-gate 32 switches to output a high logic level. Delay 36 isolates the second input to NAND-gate 34 from this change in state. NAND-gate 32 provides the high logic level signal to the first input of NAND-gate 34 thus causing NAND-gate 34 to switch to output a low logic level. At 7 ns, the external CAS signal goes high prematurely and NAND-gate 32 stays high because NAND-gate 34 provides a low logic input to NAND-gate 32. At 11 ns, delay 36 passes the delayed high output of NAND-gate 32 to inverter 38. Inverter 38 provides a low logic level signal to the second input of NAND-gate 34 thus driving the output of NAND-gate 34 to a high logic level and the output of NAND-gate 32 to a low logic level. The width of the pulse is at least equal to the length of delay introduced by delay 36 plus typical gate delays even though the XCAS pulse is too narrow.

Pulse generator 22a also produces a proper size pulse if the external CAS signal provides a pulse that is too wide. At 20 ns, the XCAS signal transitions to a low logic value. NAND-gate 32 switches to output a high logic level. Delay element 36 isolates the second input to NAND-gate 34 from this change in state. NAND-gate 32 provides the high logic level signal to the first input of NAND-gate 34 thus causing NAND-gate 34 to switch to low logic level. At 26 ns, delay element 36 passes the high logic output from NAND-gate 32 to inverter 38. Inverter 38 thus provides a low logic level to NAND-gate 34 causing the output to switch to a high logic level. At 30 ns, the XCAS signal goes high without affecting the output of NAND-gate 34. At 32 ns, the XCAS signal again goes to a low logic state beginning a new pulse. It is noted that by generating uniform low logic pulses irrespective of the duration of the low logic pulse of XCAS, pulse generator 22a also is insensitive to high logic pulses that are too short such as the pulse that is at a high logic level from 31 to 32 ns.

Figure 4:
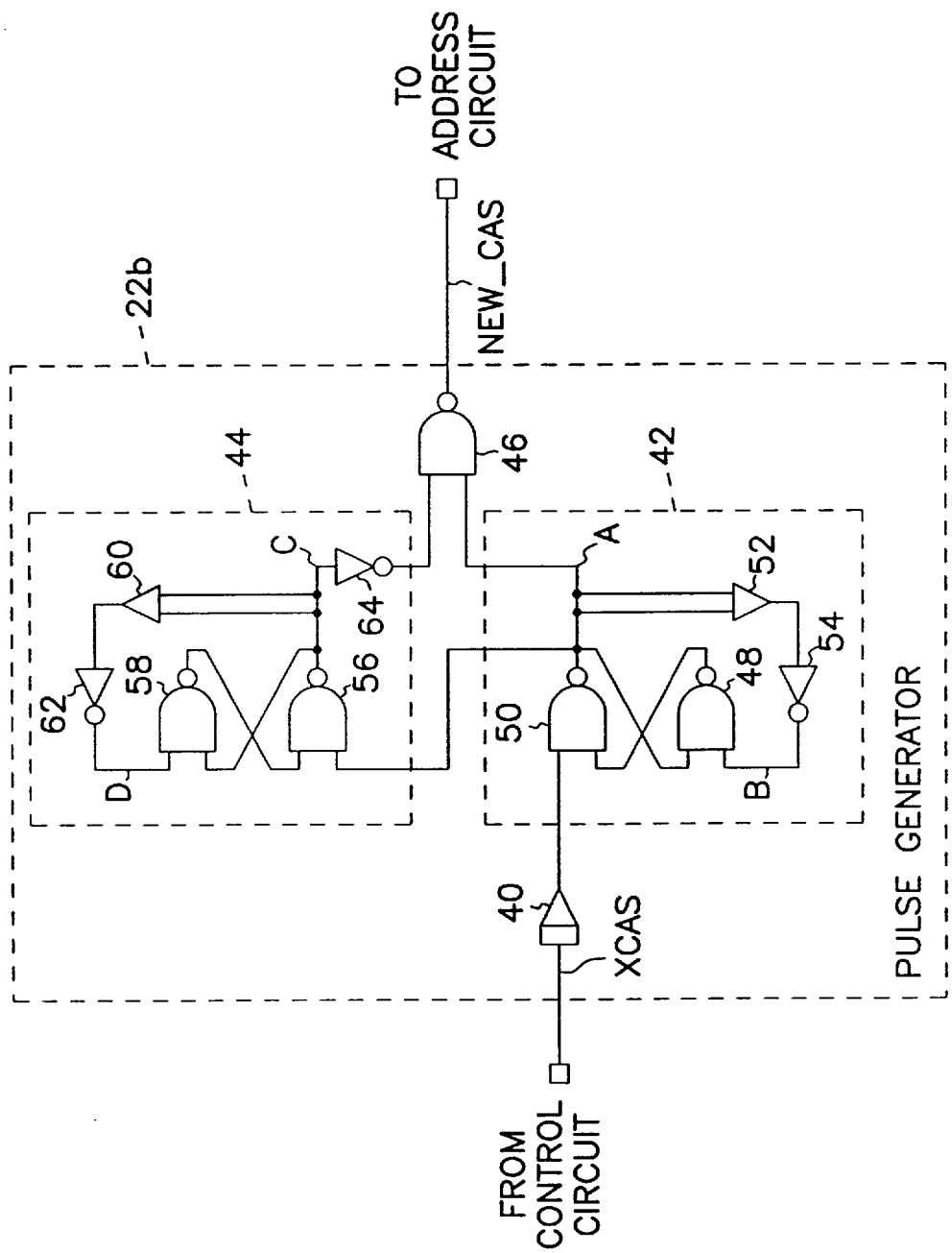
FIG. 4 is a schematic diagram of another illustrative embodiment of a pulse generator for use with the memory device of FIG. 1.

FIG. 4 depicts another illustrative embodiment of a pulse generator, indicated generally at 22b, for use in memory device 10 of FIG. 1. Pulse generator 22b comprises an input buffer 40 that is coupled to receive a control signal from control circuit 24. Input buffer 40 introduces a delay on the order of 1 to 2 nanoseconds between the input and output of pulse generator 22b. Input buffer 40 further reduces the effect of noise from the external CAS signal on the operation of pulse generator 22b. Pulse generator 22b further comprises first and second lockout circuits 42 and 44. Lockout circuit 42 extends a low logic level pulse from the external CAS signal that does not meet a minimum specification such that the pulse generated by pulse generator 22b has an acceptable duration. Lockout circuit 44, similarly, extends a high logic pulse from the external CAS signal that does not meet a minimum specification such that the pulse generated by pulse generator 22b has an acceptable duration. NAND-gate 46 is coupled to the output of both lockout circuits 42 and 44 so as to provide the output signal to address circuit 20 of FIG. 1.

First lockout circuit 42 comprises first and second NAND-gates 48 and 50 in a cross-coupled flip-flop or latch configuration. A first input of NAND-gate 50 is coupled to buffer 40. An output of NAND-gate 48 is coupled to a second input of NAND-gate 50. An output of NAND-gate 50 is coupled to a first input of NAND-gate 48. Finally, the output of NAND-gate 50 is coupled to the input of NAND-gate 48 through delay 52 and inverter 54. Delay 52 only produces a delayed output on an input signal that transitions from a low logic value to a high logic value. When the input to delay 52 transitions from a low to a high logic value, delay 52 does not delay the input signal but rather passes the signal to the output. The output of NAND-gate 50 is also coupled to address circuit 20 of FIG. 1 through NAND-gate 46.

Second lockout circuit 44 similarly comprises first and second NAND-gates 56 and 58 in a cross-coupled configuration. A first input of NAND-gate 56 is coupled to the output of NAND-gate 50 of lockout circuit 42. An output of NAND-gate 58 is coupled to a second input of NAND-gate 56. An output of NAND-gate 56 is coupled to a first input of NAND-gate 58. Further, the output of NAND-gate 56 is coupled through delay 60 and inverter 62 to a second input of inverter 58. Delay 60 operates in the same manner as delay 52. Finally, the output of NAND-gate 56 is coupled through inverter 64 to a second input of NAND-gate 46.

Figure 5A:
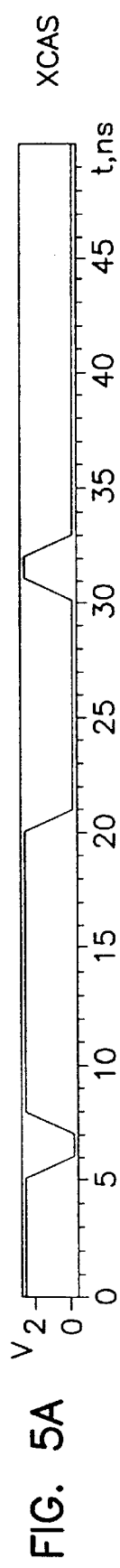
FIGS. 5A through 5F are timing diagrams that illustrate the operation of the pulse generator of FIG. 4.
Figure 5B:
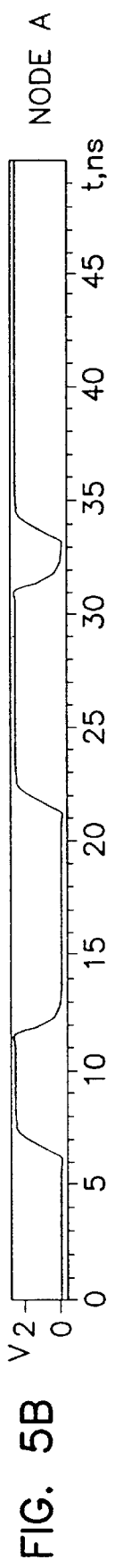
Figure 5C:
Figure 5D:
Figure 5E:
Figure 5F:

In operation, pulse generator 22b receives a control signal from control circuit 24 at input buffer 30 and produces an output signal with an acceptable pulse width for address circuit 20. FIG. 5A illustrates a typical column address strobe (CAS) signal received from an external source ("XCAS") and FIG. 5F illustrates the output of pulse generator 22a generated based on the XCAS signal. FIGS. 5B through 5E depict timing diagrams of the signals at specified nodes in pulse generator 22b in response to the XCAS signal.

In the example operation depicted in FIGS. 5A through 5F, two pulses in the XCAS signal pose problems for proper operation of a memory device. First, the low pulse at 5 ns is at a full low logic value for only 1 ns. This is shorter than specifications for a typical memory device. Thus, pulse generator 22b "extends" the pulse by producing a NEW_CAS pulse of 4 ns with a full low logic value from 8 ns to 12 ns. Further, the high logic pulse at 30 ns is too short. Again, pulse generator 22b extends this pulse producing a high pulse with a duration of 5 ns at 32 ns. The manner in which pulse generator 22b produces each pulse is described in turn.

Prior to 5 ns, the XCAS signal is at a high logic level. In this state, the latch of lockout circuit 42 is set and NAND-gate 50 outputs a low logic level to NAND-gate 46. This assures that the output of NAND-gate 46 is a high logic value. Assuming that the XCAS signal has been high for a period of time that exceeds the delay of delay 52, inverter 54 outputs a high logic level and NAND-gate 48 provides a high output signal to NAND-gate 50. Meanwhile, the low output from the latch of lockout circuit 42 places the latch of lockout circuit 44 in a clear state such that the output of NAND-gate 56 outputs a high logic value. Thus, inverter 64 provides a low logic value to NAND-gate 46.

At 5 ns, the XCAS signal of FIG. 5A transitions to a low logic level. NAND-gate 50 switches to a high logic level placing the latch of lockout circuit 42 in a clear state. It is noted that the delay between the transition of XCAS and the response of NAND-gate 50 shown in FIG. 5B is due to the delay inherent in the input buffer and a gate delay for NAND-gate 50. Delay 52 isolates the second input to NAND-gate 48 from this change in state thus the latch is not immediately reset. In lockout circuit 44, the latch is set by the output of NAND-gate 52 thus producing a high logic level at the input to NAND-gate 46. With the latch of lockout circuit 44 set, the output of lockout circuit 42 controls the output of pulse generator 22b. In this case, the XCAS signal prematurely transitions to a high logic level. However, lockout circuit 42 prevents this change in the XCAS signal from affecting NEW_CAS by delaying the reset signal to the latch of lockout circuit 42.

At 10 ns, delay 52 times out and its output transitions high. This causes the output of inverter 54 to transition low placing the latch of lockout circuit 42 back into a set state with the output of NAND-gate 50 at a low logic level. NAND-gate 46 thus produces a high output for NEW_CAS.

When NAND-gate 50 transitions to a high logic level, delay element 52 passes this value to inverter 54. Inverter 54 returns the input to NAND-gate 48 to a high logic value. The low logic output of NAND-gate 50 also clears the latch of lockout circuit 44. Thus, lockout circuit 44 produces a low output which locks NEW_CAS high until the latch of lockout circuit 44 receives a high logic input from lockout circuit 42.

Pulse generator 22b also produces a high logic pulse of sufficient duration when the XCAS signal provides a high pulse that is shorter than the specification for the memory device. In the example of FIGS. 5A through 5F, prior to 30 ns, XCAS is low and pulse generator 22b is in a steady state with the latch of lockout circuit 42 cleared and the latch of lockout circuit 44 set. Thus, pulse generator 22b produces a low logic output until XCAS goes high.

At 30 ns, the XCAS signal goes high. After the delay of input buffer 40, NAND-50 switches to a low logic value. Delay 52 does not delay the change in state of NAND-gate 50 when it goes low. Thus, inverter 54 switches to a high logic level. Further, NAND-gate 50 also clears the output of the latch of lockout circuit 44 with a high logic output from NAND-gate 56. Lockout circuit 44 provides a low output to NAND-gate 46 forcing the NEW_CAS signal to stay high until second lockout circuit 44 is reset by the output of delay 44. Thus, when XCAS switches low at 32 ns, there is no effect on the output of pulse generator 22b. The transition in XCAS does clear lockout circuit 42 by driving its output high such that the output of lockout circuit 44 controls the state of NEW_CAS.

At 36 ns, delay 60 times out and inverter 62 provides a low logic level to the reset of the latch of lockout circuit 44. This forces the latch to output a low logic value to inverter 64. Inverter 64 provides a high logic value to NAND-gate 46 which switches NEW_CAS to a low logic value. Delay 44 passes the change in the output of the latch of lockout circuit 44 to inverter 62.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the latches of lockout circuits 42 and 44 can be implemented with other types of logic gates. Further, the output of pulse generator 22a can be taken at the output of NAND-gate 32 and inverted to produce an acceptable output signal. Further, the length of the delay of delays 36, 52, and 60 can be adjusted to meet specific requirements of a specific memory device. Embodiments of the present invention are not limited to use with a CAS control signal of a DRAM memory device. Rather, embodiments of the present invention can be used to generate signals with acceptable pulse widths for other electrical devices such as clock signals for a sync DRAM or other appropriate device. Further, the timing diagrams of FIGS. 3A, 3B, and 5A through 5F are provided by way of example and not by way of limitation. For example, other voltage levels may be used for high and low logic levels. Further, the present invention is not limited by the pulse widths shown in the timing diagrams. The delay circuits can be adjusted to produce pulses of acceptable width for a particular application.

What is claimed is:

1. A method for modifying a pulsed signal, the method comprising the steps of:
    receiving the pulsed signal from an external source;
    setting a first latch based on a first logic level of the pulsed signal to extend the width of the pulse;
    setting a second latch, coupled to an output of the first latch, based on a second logic level of the pulsed signal to extend the width of the pulse; and
    selectively providing the output of the first and second latches as an output signal with a controlled pulse width.

2. The method of claim 1, wherein the step of receiving the pulsed signal comprises the step of receiving an addressing signal for a memory device from a processor based system.

3. The method of claim 1, and further comprising the step of selectively resetting the first latch with a delayed output of the first latch.

4. The method of claim 3, and further comprising the step of selectively resetting the second latch with a delayed output of the second latch.

5. The method of claim 1, wherein the step of selectively providing the output of the first and second latches as an output signal comprises the step of passing the outputs of the first and second latches through a logic gate.

6. A memory device for use with an electronic system, comprising:
    a pulse generator that includes first and second latches coupled so as to extend high and low logic pulses in a control signal from the electronic system; and
    an array of memory cells with an address circuit coupled to receive control signals from the pulse generator.

7. The memory device of claim 6, wherein an output of the first latch is coupled to the input of the second latch.

8. The memory device of claim 6, and further comprising a logic gate coupled to the output of first and second latches that creates the control signal for the pulse generator from the output of the first and second latches.

9. The memory device of claim 6, wherein an output of the first latch is coupled to a reset input of the first latch through a delay circuit.

10. The memory device of claim 6, wherein an output of the second latch is coupled to a reset input of the second latch through a delay circuit.

11. A method for modifying a pulsed control signal for a memory device, the method comprising the steps of:
    receiving the pulsed signal from an external source;
    setting a first latch based on a first logic level of the pulsed signal;
    resetting the first latch with a delayed and inverted output from the first latch so as to extend the width of pulses of the pulsed signal of the first logic level;
    setting a second latch, coupled to an output of the first latch, based on a second logic level of the pulsed signal;
    resetting the second latch with a delayed and inverted output of the second latch so as to extend the width of pulses of the pulsed signal with the second logic level; and
    selecting between the output of the first and second latches using a logic gate.

12. A signal conditioner, comprising:
    means for receiving a pulsed signal from an external source;
    means for extending the duration of low logic level pulses in the pulsed signal; and
    means for extending the duration of high logic level pulses in the pulsed signal.

13. The signal conditioner of claim 12 wherein the means for extending the duration of low logic level pulses comprises a first latch with an output coupled to a reset input of the first latch through a delay circuit.

14. The signal conditioner of claim 13 wherein the means for extending the duration of high logic level pulses comprises a second latch coupled to the output of the first latch with an output also coupled to a reset input of the second latch through a delay circuit.

* * * * *